(12) United States Patent
Kim et al.

(10) Patent No.: US 10,276,822 B2
(45) Date of Patent: Apr. 30, 2019

(54) ORGANIC LIGHT EMITTING DISPLAY DEVICE

(71) Applicant: LG Display Co., Ltd., Seoul (KR)

(72) Inventors: SungHun Kim, Iksan-si (KR);
EuiHyun Chung, Goyang-si (KR);
JungHyun Ham, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 22 days.

(21) Appl. No.: 15/621,974

(22) Filed: Jun. 13, 2017

(65) Prior Publication Data

US 2018/0062107 A1 Mar. 1, 2018

(30) Foreign Application Priority Data

Aug. 31, 2016 (KR) ........................ 10-2016-0112117

(51) Int. Cl.
*H01L 51/52* (2006.01)
*G09G 3/20* (2006.01)
*G09G 3/3258* (2016.01)
*H01L 27/32* (2006.01)

(52) U.S. Cl.
CPC ....... *H01L 51/5212* (2013.01); *G09G 3/2074* (2013.01); *G09G 3/3258* (2013.01); *H01L 27/3218* (2013.01); *H01L 27/3276* (2013.01); *G09G 2320/0633* (2013.01); *H01L 27/3216* (2013.01)

(58) Field of Classification Search
CPC ............. H01L 51/5212; H01L 27/3258; H01L 27/3218; H01L 27/3276
See application file for complete search history.

(56) References Cited

U.S. PATENT DOCUMENTS

| 2013/0057521 | A1 | 3/2013 | Kim |
| 2013/0112960 | A1 | 5/2013 | Chaji et al. |
| 2015/0200237 | A1 | 7/2015 | Yim et al. |
| 2016/0322432 | A1* | 11/2016 | Yang .................. H01L 27/3218 |

FOREIGN PATENT DOCUMENTS

WO  WO 2015062110    5/2015

OTHER PUBLICATIONS

Extended European Search Report for European Patent Application No. EP 17188502.3, dated Feb. 1, 2018, 10 Pages.

* cited by examiner

*Primary Examiner* — Anne M Hines
(74) *Attorney, Agent, or Firm* — Fenwick & West LLP

(57) ABSTRACT

An organic light emitting display device includes a plurality of data lines, a plurality of scan lines disposed intersecting with the plurality of data lines, and a plurality of sub-pixels each connected to at least one of the plurality of data lines and at least one of the plurality of scan lines. The plurality of sub-pixels includes at least a red sub-pixel, a plurality of green sub-pixels, and a blue sub-pixel. In an embodiment, a green sub-pixel and a blue sub-pixel are connected to a data line and another green sub-pixel and a red sub-pixel are connected to an adjacent data line. Thus, the sub-pixels can be seen as being disposed irregularly, so that an artifact of a displayed image can be reduced.

22 Claims, 5 Drawing Sheets

ORGANIC LIGHT EMITTING DISPLAY DEVICE

CROSS-REFERENCE TO RELATED APPLICATION

This application claims priority under 35 U.S.C. § 119(a) of Republic of Korea Patent Application No. 10-2016-0112117 filed on Aug. 31, 2016, which is incorporated herein by reference in its entirety.

BACKGROUND

Technical Field

The present disclosure relates to an organic light emitting display device and in more detail, to an organic light emitting display device improved in image quality.

Description of the Related Art

Recently, as the world entered the information age, the field of display for visually displaying electrical information signals has grown rapidly. Thus, various display devices with performance, such as thinness, lightness, and low power consumption have been developed.

Examples of the display devices include a Liquid Crystal Display (LCD) device, a Plasma Display Panel (PDP) device, a Field Emission Display (FED) device, an Organic Light Emitting Display (OLED) device, and the like.

Particularly, the OLED device is a self-emitting device and has the advantages such as a high response time, a high luminous efficiency, a high brightness, and a wide viewing angle as compared with the other display devices. Therefore, the OLED device has attracted a lot of attention.

Further, an organic light emitting diode (OLED) applied to the OLED device is regarded as a next-generation light source which is self-luminous. The OLED has excellent advantages in terms of viewing angle, contrast, response speed, and power consumption as compared with liquid crystal. Furthermore, the OLED has a surface-emitting structure and thus can be easily implemented to be flexible.

The OLED device includes at least a red sub-pixel, a green sub-pixel, and a blue sub-pixel. The red sub-pixel, the green sub-pixel, and the blue sub-pixel emit red, green, and blue lights, respectively. A full-color image may be provided through a plurality of sub-pixels. Herein, each of the sub-pixels includes an emission area where a red, green, or blue light is emitted and a non-emission area where a red, green, or blue light is not emitted.

In order to dispose organic emission layers on the red sub-pixel, the green sub-pixel, and the blue sub-pixel, a predetermined process margin is needed between the organic emission layers. Since an organic emission layer is not disposed due to a process margin, or a bank layer is disposed to define pixels, a non-emission area is present between emission areas.

Since bank layers disposed in the non-emission area are formed regularly and red sub-pixels, green sub-pixels and blue sub-pixels are disposed regularly, a color shift in which only red, green, or blue color appears in a specific linear direction may occur. In addition to the color shift, a lattice pattern can be seen.

An example of pixel array structure and organic light emitting display including the same is discussed in Korean Patent Publication No. 2014-0020120 (U.S. Pat. No. 9,324,262).

SUMMARY

The present disclosure relates to an organic light emitting display device. In the organic light emitting display device, green sub-pixels are disposed intersecting with adjacent data lines, respectively, which causes a difference in brightness between the adjacent green sub-pixels, so that sub-pixels can be seen as being disposed irregularly.

In one embodiment, the organic light emitting display device includes a blue sub-pixel and a red sub-pixel connected to data lines different from and adjacent to each other, so that the occurrence of a color shift and an artifact can be reduced.

In one embodiment, the organic light emitting display device includes a plurality of green sub-pixels connected to a scan line between a blue sub-pixel and a red sub-pixel, so that the sub-pixels can be disposed irregularly and an image quality can be improved.

The scope of the present disclosure are not limited to the aforementioned embodiments, and other embodiments, which are not mentioned above, will be apparent to a person having ordinary skill in the art from the following description.

According to an embodiment of the present disclosure, there is provided an organic light emitting display device. The organic light emitting display device includes a plurality of data lines, a plurality of scan lines disposed intersecting with the plurality of data lines, and a plurality of sub-pixels each connected to at least one of the plurality of data lines and at least one of the plurality of scan lines. The plurality of sub-pixels includes a red sub-pixel, a plurality of green sub-pixels, and a blue sub-pixel. At least one of the plurality of green sub-pixels, and at least one of the blue sub-pixel and the red sub-pixel, are connected to a first data line among the plurality of data lines. In the organic light emitting display device according to an embodiment of the present disclosure, a green sub-pixel and a blue sub-pixel are connected to a data line and the green sub-pixel and a red sub-pixel are connected to an adjacent data line. Thus, the sub-pixels can be seen as being disposed irregularly, so that the occurrence of an artifact can be reduced.

According to another embodiment of the present disclosure, there is provided an organic light emitting display device. The organic light emitting display device includes a plurality of data lines, a plurality of scan lines disposed intersecting with the plurality of data lines, and a plurality of sub-pixels each connected to at least one of the plurality of data lines and at least one of the plurality of scan lines. The plurality of sub-pixels includes a plurality of red sub-pixels, a plurality of green sub-pixels, and a plurality of blue sub-pixels. The plurality of blue sub-pixels and at least one of the plurality of green sub-pixels are connected to a first data line among the plurality of data lines. In the organic light emitting display device according to another embodiment of the present disclosure, a green sub-pixel and a blue sub-pixel are connected to a data line, so that the sub-pixels can be disposed irregularly. Therefore, an artifact displayed on the organic light emitting display device seen by a user can be minimized as compared with another display device where only one color sub-pixel is connected to a data line.

According to yet another embodiment of the present disclosure, there is provided an organic light emitting display device. The organic light emitting display device includes a plurality of data lines, a plurality of scan lines disposed intersecting with the plurality of data lines, and a plurality of sub-pixels each connected to at least one of the plurality of data lines and at least one of the plurality of scan lines. The plurality of sub-pixels includes a plurality of red sub-pixels, a plurality of green sub-pixels, and a plurality of blue sub-pixels. The plurality of blue sub-pixels, a first subset of the plurality of green sub-pixels, and a first subset of red sub-pixels are connected to a first data line among the plurality of data lines. A second subset of the plurality of green sub-pixels and a second subset of the plurality of red sub-pixels are connected to a second data line adjacent to the first data line among the plurality of data lines. In the organic light emitting display device according to yet another embodiment of the present disclosure, the plurality of green sub-pixels are not necessarily connected to a same data line. Instead, the first subset of the plurality of green sub-pixels are connected to the first data line and the second subset of the plurality of green sub-pixels are connected to the second data line, in an embodiment. Therefore, parasitic capacitance generated between adjacent green sub-pixels may cause a difference in brightness of light between the adjacent green sub-pixels. Thus, the green sub-pixels can be seen as being disposed irregularly and an image in the green sub-pixels can be compensated, so that an image quality can be improved.

Details of other embodiments will be included in the detailed description of the disclosure and the accompanying drawings.

According to an embodiment, a green sub-pixel and a blue sub-pixel are connected to a data line and another green sub-pixel and a red sub-pixel are connected to an adjacent data line. Thus, the sub-pixels can be seen as being disposed irregularly, so that an artifact can be reduced.

According to an embodiment, a blue sub-pixel, a plurality of green sub-pixels, and a red sub-pixel are disposed alternately on a scan line. Thus, an artifact which is recognized when sub-pixels are disposed regularly can be reduced, so that it is possible to provide an organic light emitting display device improved in image quality.

According to an embodiment, green sub-pixels are connected to different data lines. Therefore, parasitic capacitance generated between adjacent green sub-pixels may cause a difference in brightness of light between the plurality of green sub-pixels. Thus, the green sub-pixels can be seen as being disposed irregularly and an image in the green sub-pixels can be compensated, so that an image quality can be improved.

According to an embodiment, a difference in brightness may be caused by parasitic capacitance between a plurality of green sub-pixels adjacent to and connected to a data line or a scan line. Therefore, an image can be compensated due to non-uniformity in brightness, so that a color shift and an artifact caused by sub-pixels disposed regularly on a straight line can be reduced by the image compensation.

According to an embodiment, a plurality of sub-pixels is connected to a scan line and disposed alternately in a zig-zag pattern along the scan line. Thus, the plurality of sub-pixels is disposed irregularly, rather than as a straight line. Therefore, a color shift in which lights of one color can be seen as if emitted along one direction and an artifact can be reduced.

The scope of the present disclosure are not limited to the aforementioned embodiments, and various other embodiments are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
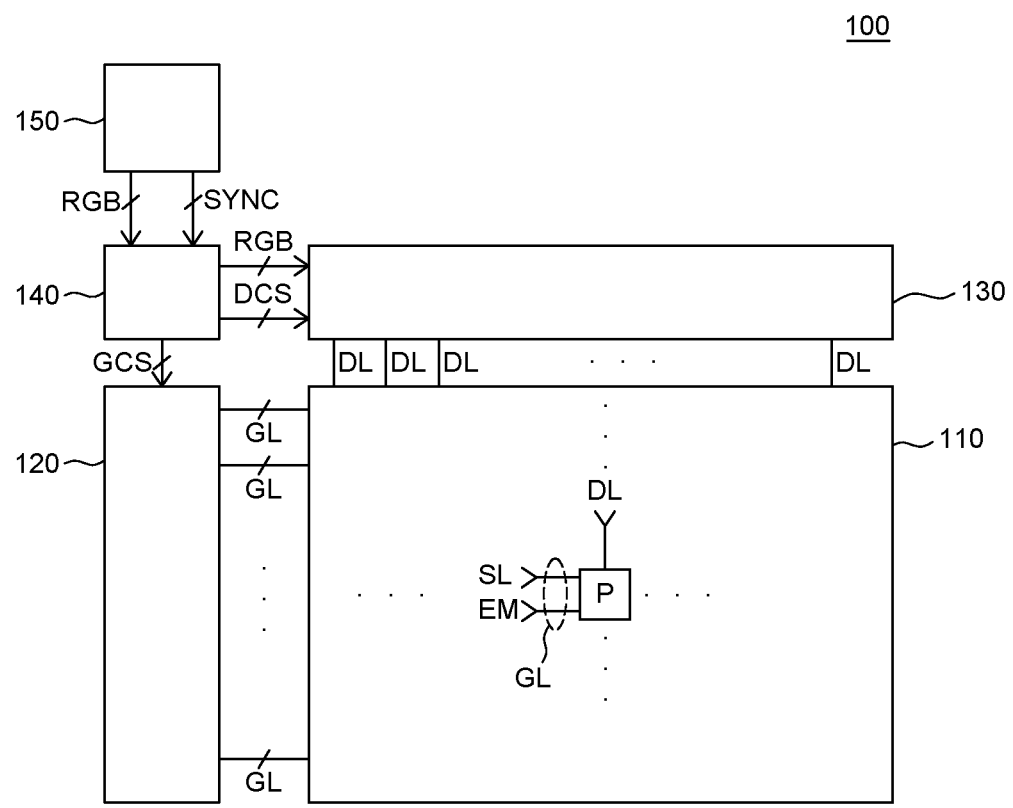
FIG. 1 is a block diagram schematically illustrating a display device according to an embodiment.

Advantages and features of the present disclosure, and methods for accomplishing the same will be more clearly understood from the embodiments described below with reference to the accompanying drawings. However, the present disclosure is not limited to the following embodiments but may be implemented in various different forms. The embodiments are provided to complete disclosure of the present disclosure and to fully provide a person having ordinary skill in the art to which the present disclosure pertains with the category of the disclosure.

The shapes, sizes, ratios, angles, numbers, and the like illustrated in the accompanying drawings for describing the embodiments of the present disclosure are merely examples, and the present disclosure is not limited thereto. Same reference numerals generally denote same elements throughout the present specification. Further, in the following description, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various embodiments of the present disclosure will be described in detail with reference to the accompanying drawings.

FIG. 1 is a block diagram schematically illustrating a display device 100 according to an embodiment. Referring to FIG. 1, a display device 100 includes a display panel 110, a gate driving circuit 120, a data driving circuit 130, a timing controller 140, and an image processor 150.

Referring to FIG. 1, the display device 100 includes the display panel 110 including a plurality of pixels P, the gate driving circuit 120 configured to supply a gate signal to each of the plurality of pixels P, the data driving circuit 130 configured to supply a data signal to each of the plurality of pixels P, and the timing controller 140 configured to control the gate driving circuit 120 and the data driving circuit 130. Further, the display device 100 includes the image processor 150 configured to receive data of an image input to the display panel 110, convert the data into a digital signal, and supply the digital signal and a control signal to the timing controller 140.

In the display panel 110, a plurality of gate lines GL and a plurality of data lines DL are disposed to intersect with each other. Thus, the plurality of pixels P may be connected to at least one of the gate lines GL and the data lines DL. In detail, one pixel P is supplied with a gate signal from the gate driving circuit 120 through a gate line GL, a data signal from the data driving circuit 130 through a data line DL, and various powers through a power supply line.

The gate driving circuit 120 supplies a gate signal to the gate lines GL in response to a gate control signal GCS supplied from the timing controller 140. In some embodiments, each of the plurality of gate lines GL includes a scan line SL and an emission control line EM. Further, the gate signal includes a scan signal and an emission control signal. Thus, one pixel P is supplied with the scan signal through the scan line SL and the emission control signal through the emission control line EM. Although FIG. 1 illustrates that the gate driving circuit 120 is disposed on one side of the display panel 110 as being spaced from the display panel 110, the number and position of the gate driving circuits 120 is not limited thereto. That is, the gate driving circuit 120 may be disposed on one side or both sides of the display panel 110 in a GIP (Gate In Panel) manner in some embodiments.

The data driving circuit 130 converts image data RGB into a data voltage in response to a data control signal DCS supplied from the timing controller 140 and supplies the converted data voltage to the pixels P through the data lines DL.

The timing controller 140 controls the timing of driving signals input to the display panel 110. In detail, the timing controller 140 processes the image data RGB input from the image processor 150 so as to be matched to the size and resolution of the display panel 110, and supplies the image data RGB to the data driving circuit 130. Further, the timing controller 140 generates a plurality of gate control signals GCS and a plurality of data control signals DCS using synchronization signals SYNC including, for example, a dot clock DCLK, a data enable signal DE, a horizontal synchronization signal Hsync, and a vertical synchronization signal Vsync, which are timing control signals input from the image processor 150. Further, the timing controller 140 supplies the generated gate control signals GCS and data control signals DCS to the gate driving circuit 120 and the data driving circuit 130, respectively, and thus controls the gate driving circuit 120 and the data driving circuit 130.

The image processor 150 is connected to the timing controller 140 that controls the timing of driving signals input to the display panel 110. The image processor 150 supplies the image data RGB and the timing control signals to the timing controller 140.

One pixel P includes a red sub-pixel, a green sub-pixel, and a blue sub-pixel. Any number of sub-pixels corresponding to each emission color may be included in one pixel P. Each of the sub-pixels is connected to at least one data line DL and at least one scan line SL. Hereinafter, the connection relationship of a sub-pixel with respect to a data line DL and a scan line SL will be described with reference to FIG. 2 through FIG. 5.

Figure 2:
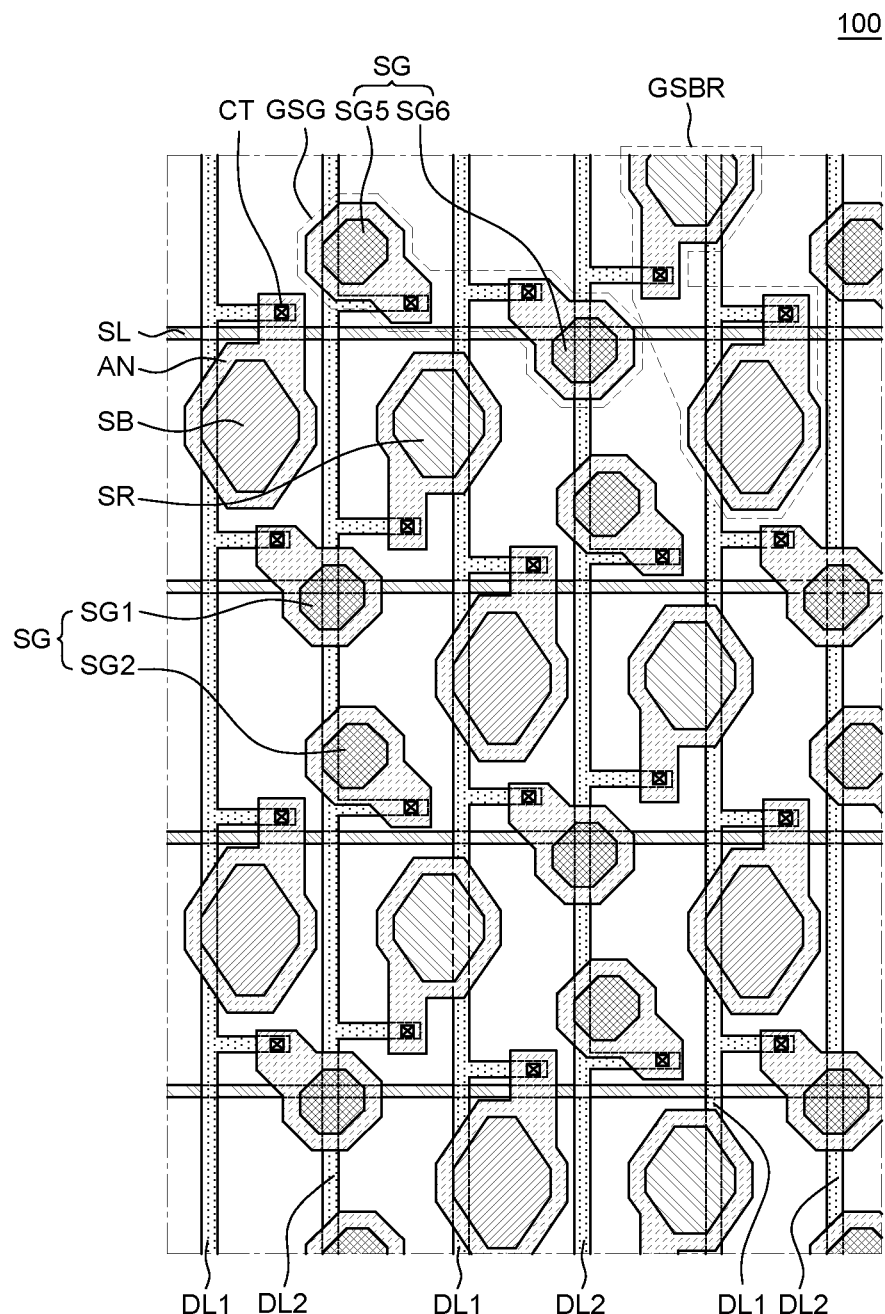
FIG. 2 is a schematic plan view of an organic light emitting display device according to an embodiment.

FIG. 2 is a schematic plan view of an organic light emitting display device 100 according to an embodiment. FIG. 1 will also be referred to for convenience in explanation.

Referring to FIG. 2, a plurality of sub-pixels is connected to at least one of a plurality of data lines DL and a plurality of scan lines SL. Herein, the plurality of sub-pixels includes a red sub-pixel SR, a green sub-pixel SG, and a blue sub-pixel SB which emit red, green, and blue lights, respectively. However, the kinds of sub-pixels are not limited thereto. For example, the organic light emitting display device 100 may further include a white sub-pixel in addition to the red sub-pixel SR, the green sub-pixel SG, and the blue sub-pixel SB.

The plurality of data lines DL includes a first data line DL1 and a second data line DL2. The first data line DL1 and the second data line DL2 illustrated in FIG. 2 may be any two data lines adjacent to each other among the plurality of data lines DL. That is, the first data line DL1 and the second data line DL2 are not predetermined data lines but refer to any two data lines adjacent to each other.

In FIG. 2, each of the plurality of sub-pixels includes an anode AN and an emission area present within the anode AN. The anode AN includes a contact hole CT and is connected to the data line DL through the contact hole CT. Although FIG. 2 illustrates that each of the data lines DL is connected to the anode AN, at least one thin film transistor may be connected between the data line DL and the contact hole CT of the anode AN. That is, the connection between the data line DL and the contact hole CT of the anode AN illustrated in FIG. 2 is schematically illustrated to exhibit the connection relationship between each of the plurality of sub-pixels and a corresponding one of the data lines DL.

Referring to FIG. 2, one of a plurality of green sub-pixels SG and at least one of the blue sub-pixel SB and the red sub-pixel SR are connected to each one of the plurality of data lines DL. Herein, the plurality of green sub-pixels SG may include at least a first green sub-pixel SG1, a second green sub-pixel SG2, a fifth green sub-pixel SG5, and a sixth green sub-pixel SG6, among additional green sub-pixels SG.

In detail, the first green sub-pixel SG1 and the blue sub-pixel SB are connected to the first data line DL1 among the plurality of data lines. Further, the second green sub-pixel SG2 and the red sub-pixel SR are connected to the second data line DL2 adjacent to the first data line DL1 among the plurality of data lines. That is, the first green sub-pixel SG1 and the second green sub-pixel SG2 are connected to different data lines. Further, the red sub-pixel SR and the blue sub-pixel SB are connected to different data lines. The green sub-pixels SG and the blue sub-pixels SB are connected alternately to the first data line DL1, and the green sub-pixels SG and the red sub-pixels SR are connected alternately to the second data line DL2. That is, the blue sub-pixel SB, the first green sub-pixel SG1, another blue sub-pixel SB, and another green sub-pixel SG in sequence are connected to the first data line DL1. Additionally, the fifth green sub-pixel SG5, the red sub-pixel SR, the second green sub-pixel SG2, and another red sub-pixel SR in sequence are connected to the second data line DL2. Herein, the first green sub-pixel SG1 and the second green sub-pixel SG2 may both overlap a vertically disposed line along an extension direction of the plurality of data lines DL.

Accordingly, sub-pixels emitting lights of at least two colors are connected alternately to one data line DL. Therefore, a sub-pixel emitting light of a given color is not connected to one data line DL consecutively with another sub-pixel emitting light of the same given color. That is, the plurality of green sub-pixels SG is divided and connected to different data lines DL, and the red sub-pixel SR and the blue sub-pixel SB are also connected to different data lines DL. Thus, lights emitted from sub-pixels connected to each data line DL may have at least two colors with respect to the data line DL. That is, irregularity is increased as compared with a case where a data line DL is connected to sub-pixels emitting lights of only one color. Since the sub-pixels emitting lights along a straight line are connected irregularly (e.g., alternating between a pair of adjacent data lines), a color shift recognized on a straight line or an artifact can be reduced remarkably. Herein, the artifact refers to a defect which is seen as a black lattice due to a bank layer between sub-pixels when a pixel emits light.

In FIG. 2, the blue sub-pixel SB and the first green sub-pixel SG1 connected to the first data line DL1 are disposed on one side of the first data line DL1. However, the positions of the blue sub-pixel SB and the first green sub-pixel SG1 are not limited to the illustration in FIG. 2. For example, the blue sub-pixel SB and the first green sub-pixel SG1 may be disposed alternately on one side and the other side of the first data line DL1 or may be overlapped on the first data line DL1.

Referring to FIG. 2, the first green sub-pixel SG1 and the second green sub-pixel SG2 may be overlapped on one data line. In detail, the first green sub-pixel SG1 and the second green sub-pixel SG2 may be overlapped on the second data line DL2.

In the embodiment shown in FIG. 2, the first green sub-pixel SG1 is connected to the first data line DL1, whereas the second green sub-pixel SG2 is connected to the second data line DL2. Thus, in the first green sub-pixel SG1, parasitic capacitance between the second data line DL2 (which is not directly connected to the first green sub-pixel SG1) and the anode AN of the first green sub-pixel SG1 is generated. The parasitic capacitance may cause a decrease in luminous efficiency of the first green sub-pixel SG1. That is, the brightness in the first green sub-pixel SG1 may be decreased due to the parasitic capacitance. Therefore, if a same data voltage is applied to each of the plurality of data lines DL, a brightness of a light emitted from the first green sub-pixel SG1 may be different from a brightness of a light emitted from the second green sub-pixel SG2. For example, if the same data voltage is applied to each of the plurality of data lines DL, the brightness of a light emitted from the first green sub-pixel SG1 is lower than the brightness of a light emitted from the second green sub-pixel SG2.

Accordingly, the plurality of green sub-pixels SG adjacent to each other along the extension direction of the data lines DL may emit lights at different brightnesses, so that a green light is seen as if emitted at a non-uniform brightness. The non-uniformity in brightness may compensate an image between sub-pixels. That is, when the brightness in some sub-pixels becomes different from the brightness in other sub-pixels, there may be an effect of compensating an image throughout the organic light emitting display device 100 including the plurality of sub-pixels.

Referring to FIG. 2, each of the red sub-pixels SR is disposed adjacent to one of the blue sub-pixels SB and thus forms a plurality of groups. In some embodiments, between each pair of adjacent groups, an equal number of green sub-pixels SG among the plurality of green sub-pixels SG are disposed. That is, the blue sub-pixel SB and the red sub-pixel SR are disposed adjacent to each other as being connected to adjacent scan lines SL. Further, a sub-pixel group GSBR including a blue sub-pixel SB and a red sub-pixel SR adjacent to each other along the extension direction of the plurality of scan lines SL is connected to each of the plurality of scan lines SL between green sub-pixel groups GSG including the plurality of green sub-pixels SG5 and SG6.

In one embodiment, the plurality of green sub-pixels SG includes the fifth green sub-pixel SG5 and the sixth green sub-pixel SG6. The blue sub-pixel SB, the fifth green sub-pixel SG5, the sixth green sub-pixel SG6, and the red sub-pixel SR are connected in sequence to each of the plurality of scan lines SL. For example, a plurality of sub-pixels including a blue sub-pixel, a green sub-pixel, a green sub-pixel, a red sub-pixel, a blue sub-pixel, a green sub-pixel, a green sub-pixel, a red sub-pixel, a blue sub-pixel, a green sub-pixel, a green sub-pixel, a red sub-pixel, etc. may be connected in order or in sequence to one scan line SL.

Referring to FIG. 2, the fifth green sub-pixel SG5 and the sixth green sub-pixel SG6 are not disposed on a straight line, but disposed alternately on one side and the other side with respect to the scan line SL. Further, with respect to the scan line SL, a blue sub-pixel SB is disposed below the scan line SL, green sub-pixels are disposed above and below the scan line SL, and a red sub-pixel is disposed above the scan line SL. That is, the plurality of sub-pixels including the blue sub-pixel SB, the fifth green sub-pixel SG5, the sixth green sub-pixel SG6, and the red sub-pixel SR in order is connected to the scan line SL while being disposed alternately in a zig-zag pattern (e.g., alternating above and below) with respect to the scan line SL.

Accordingly, the plurality of sub-pixels is not disposed regularly on a straight line. Thus, a color shift in which lights of one color can be seen as if emitted along one direction and an artifact may be reduced.

Referring to FIG. 2, the fifth green sub-pixel SG5 and the sixth green sub-pixel SG6 are connected to different data lines DL. Further, the fifth green sub-pixel SG5 and the sixth green sub-pixel SG6 may be disposed on different data line DL. For example, the fifth green sub-pixel SG5 may be connected to the second data line DL2 while being overlapped on the same second data line DL2. Further, the sixth green sub-pixel SG6 may be connected to the first data line DL1 adjacent to the right of the second data line DL2 (on which the fifth green sub-pixel SG5 is overlapped). The sixth green sub-pixel SG6 may also be overlapped on another second data line DL2 adjacent to the right of the aforementioned first data line DL1.

Herein, the fifth green sub-pixel SG5 is connected to the second data line DL2 and also overlapped on the same second data line DL2 to which the fifth green sub-pixel SG5 is connected. And, the sixth green sub-pixel SG6 is connected to the first data line DL1 and also overlapped on another second data line DL2. Thus, in the sixth green sub-pixel SG6, parasitic capacitance between the anode AN of the sixth green sub-pixel SG6 and the second data line DL2 is generated.

Accordingly, the parasitic capacitance may cause a decrease in luminous efficiency of the sixth green sub-pixel SG6. That is, the brightness in the sixth green sub-pixel SG6 may be decreased due to the parasitic capacitance.

Therefore, if the same data voltage is applied to each of the plurality of data lines DL, the brightness of a light emitted from the fifth green sub-pixel SG5 may be different from the brightness of a light emitted from the sixth green sub-pixel SG6. For example, if the same data voltage is applied to each of the plurality of data lines DL, the brightness of a light emitted from the sixth green sub-pixel SG6 is lower than the brightness of a light emitted from the fifth green sub-pixel SG5.

Accordingly, the plurality of green sub-pixels SG connected to different data lines DL emit green lights at different brightnesses even when the same data voltage is applied thereto. The green lights at different brightnesses can be seen as if different green lights are emitted. Therefore, a color shift and an artifact of the green lights may be reduced. That is, since the green sub-pixels SG adjacent to each other are connected to different data lines DL, parasitic capacitance is generated, so that there may be an effect of compensating an image between the green sub-pixels SG due to the parasitic capacitance.

In the organic light emitting display device 100 according to an embodiment, the green sub-pixels SG are connected to different data lines DL and overlapped on different data lines DL. Thus, parasitic capacitance is generated between adjacent green sub-pixels SG. The parasitic capacitance generated between the adjacent green sub-pixels SG causes a difference in brightness of light between the plurality of green sub-pixels SG. Since there is a difference in brightness of light between the plurality of green sub-pixels SG, the green sub-pixels SG can be seen as being disposed irregularly and an image in the green sub-pixels SG may be compensated, so that an image quality may be improved.

Further, in the organic light emitting display device 100 according to an embodiment, the green sub-pixels SG vertically adjacent to each other along the data line DL are each connected to different data lines DL. Further, adjacent red sub-pixels SR and blue sub-pixels SB are connected to different data lines DL. Thus, the red and blue sub-pixels can be seen as being disposed irregularly. Furthermore, the green sub-pixels SG are not disposed on a straight line but disposed in a zig-zag pattern with respect to the scan line SL. Thus, the green sub-pixels can be seen as being disposed irregularly, which may reduce an artifact or color shift caused by linear alignment of sub-pixels.

Furthermore, in the organic light emitting display device 100 according to an embodiment, a difference in brightness is caused by parasitic capacitance between the plurality of green sub-pixels SG adjacent to and connected to the data line DL or the scan line SL. Therefore, an image can be compensated due to non-uniformity in brightness, so that a color shift and an artifact caused by sub-pixels disposed regularly on a straight line may be reduced by the image compensation.

Accordingly, in the organic light emitting display device 100 according to an embodiment, an image can be compensated due to the non-uniformity in brightness caused by the green sub-pixels SG. Also, the red sub-pixel SR, the green sub-pixel SG, and the blue sub-pixel SB can be seen as being disposed irregularly, which may reduce an artifact and a color shift in a displayed image. Thus, an image quality of the organic light emitting display device 100 can be improved.

Figure 3:
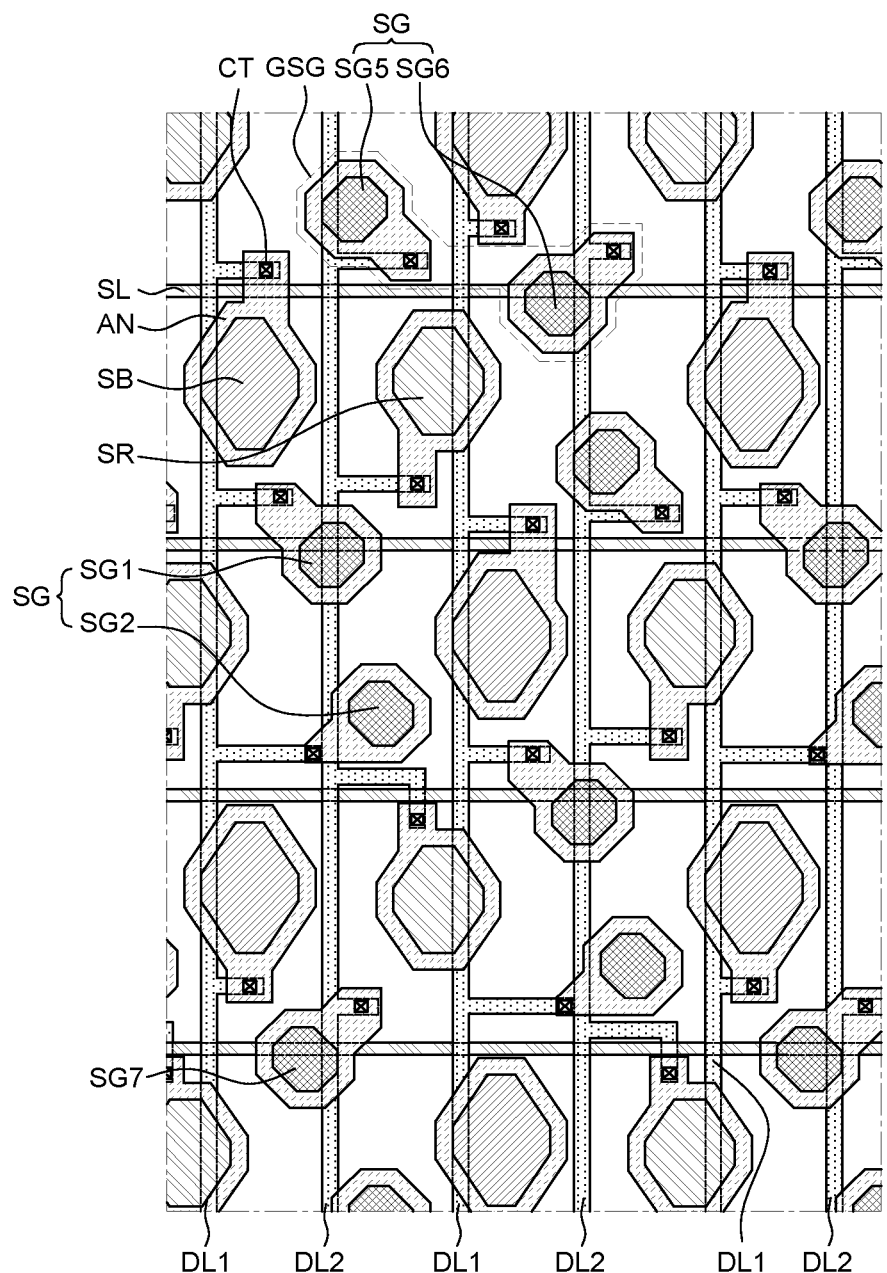
FIG. 3 is a schematic plan view of an organic light emitting display device according to an embodiment.

FIG. 3 is a schematic plan view of an organic light emitting display device 300 according to an embodiment. The organic light emitting display device 300 illustrated in FIG. 3 is substantially the same as the organic light emitting display device 100 illustrated in FIG. 2 except for the connection relationships among sub-pixels. Therefore, a redundant explanation thereof will be omitted herein.

Referring to FIG. 3, green sub-pixels SG and blue sub-pixels SB or red sub-pixels SR are connected to each of the data lines DL. Additionally, the first green sub-pixel SG1 and the second green sub-pixel SG2 are connected to the same data line. In detail, the first green sub-pixel SG1 and the second green sub-pixel SG2 vertically adjacent to each other are connected to the first data line DL1. Thus, a plurality of sub-pixels including the blue sub-pixel SB, the first green sub-pixel SG1, the second green sub-pixel SG2, and another blue sub-pixel SB in order or in sequence may be connected to the first data line DL1. Additionally, a plurality of sub-pixels including the green sub-pixel SG5, the red sub-pixel SR, another red sub-pixel SR, and another green sub-pixel SG in order or in sequence may be connected to the second data line DL2.

Referring to FIG. 3, the first green sub-pixel SG1 and the second green sub-pixel SG2 may be disposed to overlap a same data line DL. For example, the first green sub-pixel SG1 and the second green sub-pixel SG2 may be disposed to overlap on the second data line DL2. The plurality of green sub-pixels SG may be disposed as being connected to the first data line DL1 and the second data line DL2 in a pattern such as the second data line DL2, the first data line DL1, the first data line DL1, the second data line DL2, the second data line DL2, the first data line DL1, the first data line DL1, the second data line DL2, etc (e.g., alternating every two data lines).

In the embodiment shown in FIG. 3, the first green sub-pixel SG1 and the second green sub-pixel SG2 may be connected to the first data line DL1 while being overlapped on the second data line DL2. Parasitic capacitance may be generated between the second data line DL2 and the anodes AN of each of the first green sub-pixel SG1 and the second green sub-pixel SG2. The parasitic capacitance may cause a decrease in luminous efficiency of the first green sub-pixel SG1 and the second green sub-pixel SG2. That is, the brightness in the first green sub-pixel SG1 and the second green sub-pixel SG2 may be decreased due to the parasitic capacitance.

In the embodiment shown in FIG. 3, the green sub-pixel SG5 connected to the second data line DL2 above the first green sub-pixel SG1 is overlapped with the second data line DL2. Therefore, the green sub-pixel SG5 is less affected by parasitic capacitance than the first green sub-pixel SG1. Further, the green sub-pixel SG7 connected to the second data line DL2 below the second green sub-pixel SG2 is also overlapped with the second data line DL2. Therefore, it is less affected by parasitic capacitance than the second green sub-pixel SG2. Thus, if the same data voltage is applied to each of the plurality of data lines DL, the brightness of the first green sub-pixel SG1 may be different from the brightness of the green sub-pixel SG5 connected to the second data line DL2 above the first green sub-pixel SG1. Also, the brightness of the second green sub-pixel SG2 may be different from the brightness of the green sub-pixel SG7 connected to the second data line DL2 below the second green sub-pixel SG2. For example, the brightness of the green sub-pixel SG5 connected to the second data line DL2 above the first green sub-pixel SG1 and the brightness of the green sub-pixel SG7 connected to the second data line DL2 below the second green sub-pixel SG2 are greater than the brightness of each of the first green sub-pixel SG1 and the brightness of the second green sub-pixel SG2.

Accordingly, parasitic capacitance may cause a difference in brightness of adjacent green sub-pixels SG along the extension direction of the data lines DL. For example, some of the green sub-pixels SG vertically adjacent to each other hayed a decreased brightness due to the parasitic capacitance. Further, other green sub-pixels SG vertically adjacent to each other are less affected by parasitic capacitance and thus are not decreased in brightness. As such, in a group of green sub-pixels adjacent to each other, parasitic capacitance causes non-uniformity in brightness. Therefore, a green light is seen as if emitted at a non-uniform brightness throughout the organic light emitting display device 300. The non-uniformity in brightness may compensate an image between a plurality of sub-pixels. That is, when the brightness of some sub-pixels becomes different from the brightness of other sub-pixels, there may be an effect of compensating an image throughout the organic light emitting display device 300 including the plurality of sub-pixels.

In the embodiment shown in FIG. 3, the blue sub-pixel SB is connected to the first data line DL1, which is also connected to the first green sub-pixel SG1 and the second green sub-pixel SG2. The blue sub-pixel SB is disposed above the first green sub-pixel SG1 and the second green sub-pixel SG2.

Referring to FIG. 3, the fifth green sub-pixel SG5 and the sixth green sub-pixel SG6 may be connected to different second data lines DL2 and disposed to overlap different second data lines DL2. That is, the fifth green sub-pixel SG5 is connected to the second data line DL2 while being overlapped on the same second data line DL2. Further, the sixth green sub-pixel SG6 is connected to another second data line DL2 adjacent to the second data line DL2 connected to the fifth green sub-pixel SG5 (with a first data line DL1 in between), and the sixth green sub-pixel SG6 overlaps the second data line DL2 to which the sixth green sub-pixel SG6 is connected.

Thus, the fifth green sub-pixel SG5 and the sixth green sub-pixel SG6 are disposed as being overlapped on the data line DL connected to the fifth green sub-pixel SG5 and the sixth green sub-pixel SG6, respectively. Therefore, parasitic capacitance is not generated between the anodes AN of the fifth green sub-pixel SG5 and the sixth green sub-pixel SG6 and another data line DL which is not connected thereto.

Accordingly, if the same data voltage is applied to each of the plurality of data lines DL, lights emitted from the fifth green sub-pixel SG5 and the sixth green sub-pixel SG6 may have substantially the same brightness. Thus, the green sub-pixels SG adjacent to each other among the green sub-pixels SG connected to a scan line SL may emit lights at the same brightens.

Figure 4:
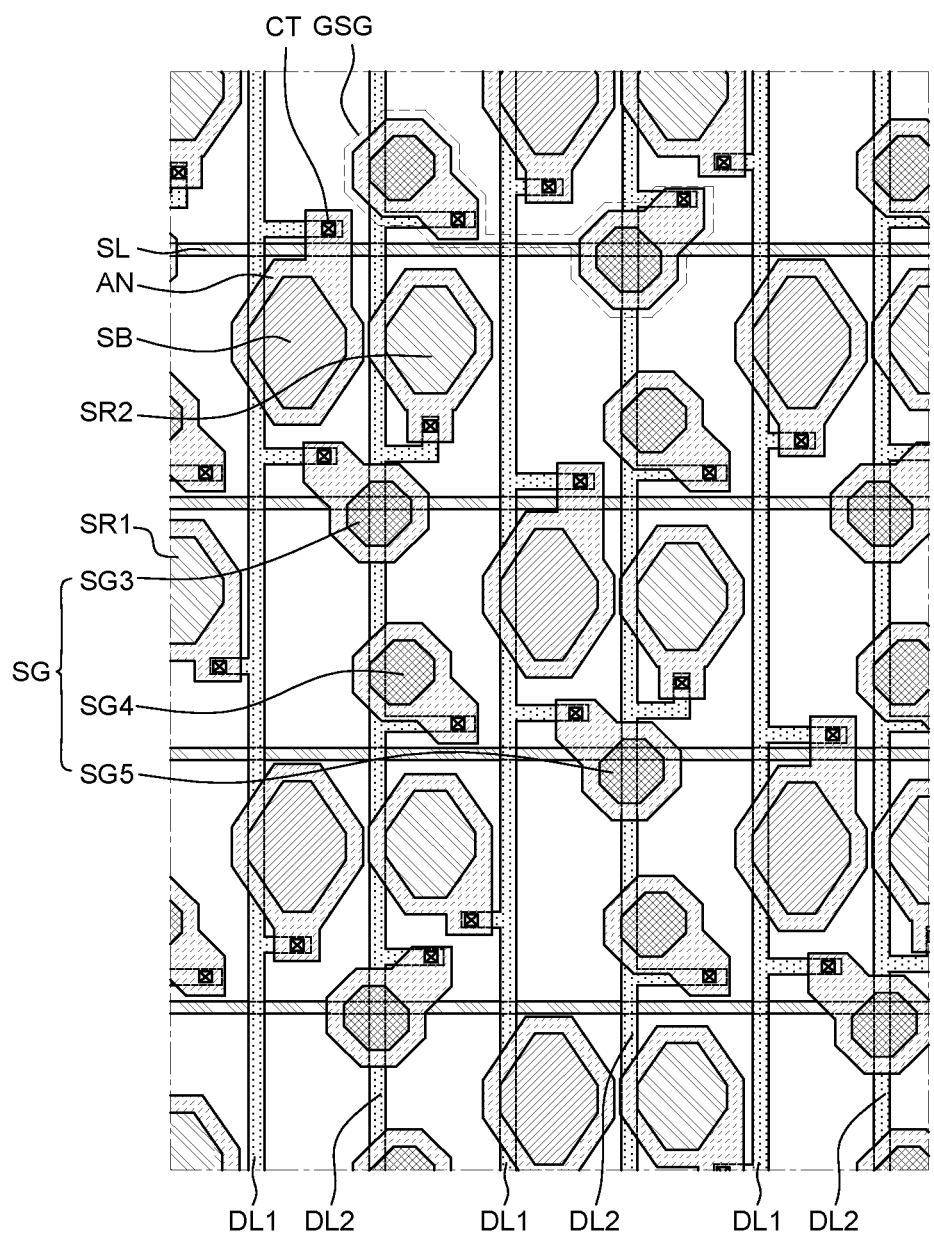
FIG. 4 is a schematic plan view of an organic light emitting display device according to an embodiment.

FIG. 4 is a schematic plan view of an organic light emitting display device 400 according to an embodiment. The organic light emitting display device 400 illustrated in FIG. 4 is substantially the same as the organic light emitting display device 100 illustrated in FIG. 2 except for the connection relationships among sub-pixels. Therefore, a redundant explanation thereof will be omitted herein.

Referring to FIG. 4, one of the plurality of green sub-pixels SG, two blue sub-pixels SB, and a red sub-pixel SR1 are connected to the first data line DL1 among the plurality of data lines. Herein, the green sub-pixels SG may include at least the green sub-pixel SG3, green sub-pixel SG4, and green sub-pixel SG5.

In detail, the third green sub-pixel SG3, the red sub-pixel SR1, and two blue sub-pixels SB are connected to the first data line DL1 among the plurality of data lines DL. A plurality of green sub-pixels SG including at least the green sub-pixel SG4 and the red sub-pixel SR2 are connected to the second data line DL2 adjacent to the first data line DL1 among the plurality of data lines DL. That is, green sub-pixels SG, red sub-pixels SR, and blue sub-pixels SB are connected to the first data line DL1, whereas green sub-pixels SG and red sub-pixels SR are connected to the second data line DL2. Also, the blue sub-pixel SB, the green sub-pixel SG3, the red sub-pixel SR1, and the other blue sub-pixel SB are connected in order or in sequence to the first data line DL1. Further, a green sub-pixel SG, the red sub-pixel SR2, the green sub-pixel SG4, and another green sub-pixel SG are connected in order to the second data line DL2.

Accordingly, sub-pixels emitting three different colors of light are connected to data line DL1 and sub-pixels emitting two colors of light are connected to its adjacent data line DL2 in an embodiment. Thus, between the data lines DL adjacent to each other, there may be differences in the number of sub-pixels connected thereto and in the number of different colors of light emitted from the sub-pixels. That is, in the organic light emitting display device 400, irregularity is increased as compared with an organic light emitting display device in which sub-pixels emitting two colors of light are disposed with respect to one data line DL and sub-pixels emitting lights of one color are disposed on an adjacent data line DL. Since the sub-pixels emitting lights along a straight line are connected irregularly, the sub-pixels may be disposed irregularly. Further, a color shift recognized on a straight line or an artifact may be reduced remarkably.

Referring to FIG. 4, the third green sub-pixel SG3 and the fourth green sub-pixel SG4 may be disposed as being overlapped on a same data line DL. For example, the third green sub-pixel SG3 and the fourth green sub-pixel SG4 may be disposed to be overlapped on the second data line DL2.

Herein, the third green sub-pixel SG3 is connected to the first data line DL1, whereas the fourth green sub-pixel SG4 is connected to the second data line DL2. Thus, in the third green sub-pixel SG3, parasitic capacitance between the second data line DL2 (which is not directly connected to the third green sub-pixel SG3) and the anode AN of the third green sub-pixel SG3 is generated. The parasitic capacitance may cause a decrease in luminous efficiency of the third green sub-pixel SG3. That is, the brightness in the third green sub-pixel SG3 may be decreased due to the parasitic capacitance. Thus, if the same data voltage is applied to each of the plurality of data lines DL, the brightness of a light emitted from the third green sub-pixel SG3 may be different from the brightness of a light emitted from the fourth green sub-pixel SG4. For example, if the same data voltage is applied to each of the plurality of data lines DL, the brightness of a light emitted from the third green sub-pixel SG3 is lower than the brightness of a light emitted from the fourth green sub-pixel SG4.

Accordingly, some of the green sub-pixels SG adjacent to each other along the extension direction of the data lines DL emit lights at different brightnesses, so that a green light is seen as if emitted at a non-uniform brightness. The non-uniformity in brightness may compensate an image between sub-pixels. That is, when the brightness in some sub-pixels becomes different from the brightness in other sub-pixels, there may be an effect of compensating an image throughout the organic light emitting display device 400 including the plurality of sub-pixels.

Referring to FIG. 4, the fourth green sub-pixel SG4 and the fifth green sub-pixel SG5 are connected to different data lines DL. Further, the fourth green sub-pixel SG4 and the fifth green sub-pixel SG5 may be disposed on different data lines DL. For example, the fourth green sub-pixel SG4 may be connected to the second data line DL2 while being overlapped on the same second data line DL2. Further, the fifth green sub-pixel SG5 may be connected to the first data line DL1 while being overlapped on an adjacent second data line DL2 disposed on the right side of the first data line DL1 as shown in FIG. 4. Therefore, in the fourth green sub-pixel SG4, parasitic capacitance is not generated between the anode AN of the green sub-pixel SG4 and the second data line DL2 to which it is connected. However, in the fifth green sub-pixel SG5, parasitic capacitance may be generated between the anode AN of the fifth green sub-pixel SG5 and the second data line DL2 adjacent to the first data line DL1 (to which the fifth green sub-pixel SG5 is connected). Thus, the brightness in the fifth green sub-pixel SG5 may be decreased due to the parasitic capacitance.

Therefore, if the same data voltage is applied to each of the plurality of data lines DL, the brightness of a light emitted from the fourth green sub-pixel SG4 may be different from the brightness of a light emitted from the fifth green sub-pixel SG5. For example, if the same data voltage is applied to each of the plurality of data lines DL, the brightness of a light emitted from the fifth green sub-pixel SG5 is lower than the brightness of a light emitted from the fourth green sub-pixel SG4.

Accordingly, the plurality of green sub-pixels SG connected to different data lines DL emit green lights at different brightnesses even when the same data voltage is applied thereto. The green lights at different brightnesses can be seen as if different green lights are emitted. Therefore, a color shift and an artifact of the green lights can be reduced. That is, since the green sub-pixels SG adjacent to each other are connected to different data lines DL, parasitic capacitance is generated, so that there may be an effect of compensating an image between the green sub-pixels SG due to the parasitic capacitance.

Referring to FIG. 4, the fourth green sub-pixel SG4 and the fifth green sub-pixel SG5 are not disposed on a straight line, but disposed alternately on one side and the other side with respect to a scan line SL. Further, with respect to the scan line SL connected to the fourth green sub-pixel SG4 and the fifth green sub-pixel SG5, green sub-pixels SG are disposed above and below the scan line SL, a blue sub-pixel SB is disposed above the scan line SL, and a red sub-pixel SR is disposed below the scan line SL. These sub-pixels are connected to the scan line SL while being disposed alternately in a zig-zag pattern with respect to the scan line SL. Accordingly, these sub-pixels are not disposed regularly on a straight line. Thus, a color shift in which lights of one color can be seen as if emitted along one direction and an artifact can be reduced.

Figure 5:
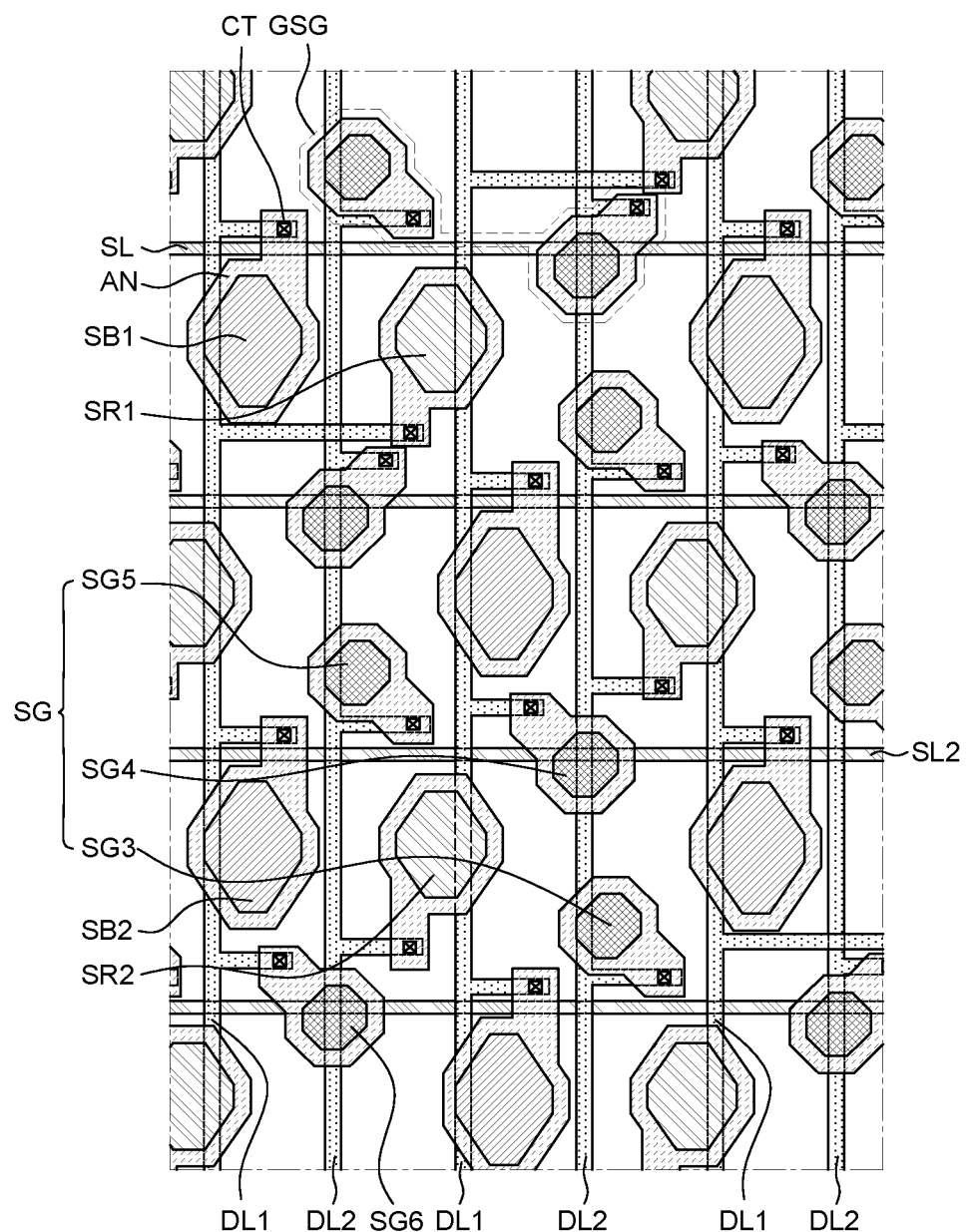
FIG. 5 is a schematic plan view of an organic light emitting display device according to an embodiment.

FIG. 5 is a schematic plan view of an organic light emitting display device 500 according to an embodiment. The organic light emitting display device 500 illustrated in FIG. 5 is substantially the same as the organic light emitting display device 400 illustrated in FIG. 4 except for the connection relationships among sub-pixels. Therefore, a redundant explanation thereof will be omitted herein.

Referring to FIG. 5, green sub-pixels SG6, two blue sub-pixels SB1 and SB2, and red sub-pixel SR1 are connected to the first data line DL1 among the plurality of data lines DL. Further, green sub-pixels SG and red sub-pixel SR2 are connected to the second data line DL2 adjacent to the right of the aforementioned first data line DL1 as shown in FIG. 5. That is, green sub-pixels SG, red sub-pixels SR, and blue sub-pixels SB are connected to the first data line DL1, whereas green sub-pixels SG and red sub-pixels SR are connected to the second data line DL2. Also, the blue sub-pixel SB1, the red sub-pixel SR1, the blue sub-pixel SB2, and the green sub-pixel SG6 are connected in order or in sequence to the first data line DL1. Further, a green sub-pixel SG, another green sub-pixel SG, the green sub-pixel SG5, and the red sub-pixel SR2 are connected in order or in sequence to the second data line DL2.

Accordingly, sub-pixels emitting three different colors of light are connected to data line DL1 and sub-pixels emitting two colors of light are connected to its adjacent data line DL2 in an embodiment. Thus, between the data lines DL adjacent to each other, there may be differences in the number of sub-pixels connected thereto and in the number of different colors of light emitted from the sub-pixels. That is, in the organic light emitting display device 500, irregularity is increased as compared with an organic light emitting display device in which sub-pixels emitting two colors of light are disposed with respect to a data line DL and sub-pixels emitting lights of one color are disposed in an adjacent data line DL. Since the sub-pixels emitting lights along a straight line are connected irregularly, the sub-pixels may be disposed irregularly. Further, a color shift recognized on a straight line or an artifact may be reduced remarkably.

Referring to FIG. 5, the third green sub-pixel SG3 and the fourth green sub-pixel SG4 may be disposed as being overlapped on one data line DL. For example, the third green sub-pixel SG3 and the fourth green sub-pixel SG4 may be disposed to be overlapped on the second data line DL2.

Herein, the third green sub-pixel SG3 is connected to the second data line DL2 to which the third green sub-pixel SG3 overlaps, whereas the fourth green sub-pixel SG4 is connected to the first data line DL1 (adjacent to the left of the aforementioned second data line DL2). Thus, in the fourth green sub-pixel SG4, parasitic capacitance between the second data line DL2 (which is not directly connected to the fourth green sub-pixel SG4) and the anode AN of the fourth green sub-pixel SG4 is generated. The parasitic capacitance may cause a decrease in luminous efficiency of the fourth green sub-pixel SG4. That is, the brightness in the fourth green sub-pixel SG4 may be decreased due to the parasitic capacitance. Thus, if the same data voltage is applied to each of the plurality of data lines DL, the brightness of a light emitted from the third green sub-pixel SG3 is different from the brightness of a light emitted from the fourth green sub-pixel SG4. For example, if the same data voltage is applied to each of the plurality of data lines DL, the brightness of a light emitted from the fourth green sub-pixel SG4 is lower than the brightness of a light emitted from the third green sub-pixel SG3.

Accordingly, green sub-pixels SG adjacent to each other along the extension direction of the data lines DL emit lights at different brightnesses, so that a green light is seen as if emitted at a non-uniform brightness. The non-uniformity in brightness may compensate an image between sub-pixels. That is, when the brightness in some sub-pixels becomes different from the brightness in other sub-pixels, there may be an effect of compensating an image throughout the organic light emitting display device 500 including the plurality of sub-pixels.

Referring to FIG. 5, the fourth green sub-pixel SG4 and the fifth green sub-pixel SG5 are connected to different data lines DL. Further, the fourth green sub-pixel SG4 and the fifth green sub-pixel SG5 may be disposed on different data lines DL. In detail, the fifth green sub-pixel SG5 may be connected to the second data line DL2 while being overlapped on the same second data line DL2 to which the fifth green sub-pixel SG5 is connected. Further, the fourth green sub-pixel SG4 may be connected to the first data line DL1 (adjacent to the right of the aforementioned second data line DL2) while being overlapped on another second data line DL2 disposed on the right side of the aforementioned first data line DL1. Therefore, in the fourth green sub-pixel SG4, parasitic capacitance is generated between the anode AN of the fourth green sub-pixel SG4 and the second data line DL2 that the fourth green sub-pixel SG4 overlaps. However, in the fifth green sub-pixel SG5, parasitic capacitance may not be generated between the anode AN of the fifth green sub-pixel SG5 and the second data line DL2 to which the fifth green sub-pixel SG5 is connected. Thus, the brightness in the fourth green sub-pixel SG4 may be decreased due to the parasitic capacitance.

Therefore, if the same data voltage is applied to each of the plurality of data lines DL, the brightness of a light emitted from the fourth green sub-pixel SG4 is different from the brightness of a light emitted from the fifth green sub-pixel SG5. For example, if the same data voltage is applied to each of the plurality of data lines DL, the brightness of a light emitted from the fourth green sub-pixel SG4 is lower than the brightness of a light emitted from the fifth green sub-pixel SG5.

Accordingly, the plurality of green sub-pixels SG connected to different data lines DL emit green lights at different brightnesses even when the same data voltage is applied thereto. As such, the green lights at different brightnesses can be seen as if different green lights are emitted. Therefore, a color shift and an artifact of the green lights can be reduced. That is, since the green sub-pixels SG adjacent to each other are connected to different data lines DL, parasitic capacitance is generated, so that there may be an effect of compensating an image between the green sub-pixels SG due to the parasitic capacitance.

Referring to FIG. 5, the fourth green sub-pixel SG4 and the fifth green sub-pixel SG5 are not disposed on a straight line, but disposed alternately on one side and the other side with respect to the scan line SL2. Further, with respect to the scan line SL2 connected to the fourth green sub-pixel SG4 and the fifth green sub-pixel SG5, the blue sub-pixel SB2 is disposed below the scan line SL2, green sub-pixels SG are disposed above and below the scan line SL2, and the red sub-pixel SR2 is disposed below the scan line SL2. That is, the sub-pixels are connected to the scan line SL2 while being disposed alternately in a zig-zag pattern with respect to the scan line SL2. Accordingly, these sub-pixels are not disposed regularly on a straight line. Thus, a color shift in which lights of one color can be seen as if emitted along one direction and an artifact may be reduced.

The embodiments of the present disclosure can also be described as follows.

According to an embodiment of the present disclosure, an organic light emitting display device includes a plurality of data lines, a plurality of scan lines disposed intersecting with the plurality of data lines, and a plurality of sub-pixels each connected to at least one of the plurality of data lines and at least one of the plurality of scan lines. The plurality of sub-pixels includes a red sub-pixel, a plurality of green sub-pixels, and a blue sub-pixel. At least one of the plurality of green sub-pixels, and at least one of the blue sub-pixel and the red sub-pixel, are connected to a first data line among the plurality of data lines. In the organic light emitting display device according to an aspect of the present disclosure, a green sub-pixel and a blue sub-pixel are connected to a data line and another green sub-pixel and a red sub-pixel are connected to an adjacent data line. Thus, the sub-pixels can be seen as being disposed irregularly, so that the occurrence of an artifact may be reduced.

According to an embodiment, the plurality of green sub-pixels may include a first green sub-pixel and a second green sub-pixel. The first green sub-pixel and the blue sub-pixel may be connected to the first data line among the plurality of data lines. The second green sub-pixel and the red sub-pixel may be connected to a second data line adjacent to the first data line among the plurality of data lines. The first green sub-pixel and the second green sub-pixel may be vertically disposed along an extension direction of the plurality of data lines.

According to an embodiment, the first green sub-pixel and the second green sub-pixel may be connected to different data lines.

According to an embodiment, responsive to a same data voltage applied to each of the plurality of data lines, a brightness of light emitted from the first green sub-pixel may be different from another brightness of light emitted from the second green sub-pixel.

According to an embodiment, the blue sub-pixel and a first subset of the plurality of green sub-pixels may be connected to the first data line among the plurality of data lines. The red sub-pixel and a second subset of the plurality of green sub-pixels may be connected to a second data line adjacent to the first data line among the plurality of data lines. The first subset of the plurality of green sub-pixels may be vertically disposed along an extension direction of the first data line. The second subset of the plurality of green sub-pixels may be vertically disposed along another extension direction of the second data line.

According to an embodiment, the first subset of the plurality of green sub-pixels may be overlapped with the second data line, and the second subset of the plurality of green sub-pixels may also be overlapped with the second data line.

According to an embodiment, each of the first green sub-pixel and the second green sub-pixel may be disposed to be overlapped on the second data line adjacent to the first data line.

According to an embodiment, the blue sub-pixel and the red sub-pixel may be adjacent to each other along an extension direction of the plurality of scan lines. A sub-pixel group including the blue sub-pixel and the red sub-pixel adjacent to each other along the extension direction of the plurality of scan lines may be connected to at least one of the plurality of scan lines between a subset of the plurality of green sub-pixels.

According to an embodiment, each of the red sub-pixel and the blue sub-pixel may be plural in number. The plurality of red sub-pixels, the plurality of green sub-pixels, and the plurality of blue sub-pixels may be connected to one scan line of the plurality of scan lines. Each of the plurality of red sub-pixels may be disposed adjacent to a corresponding one of the plurality of blue sub-pixels and may form a plurality of groups. An equal number of green sub-pixels among the plurality of green sub-pixels may be disposed between adjacent groups of the plurality of groups.

According to an embodiment, a fifth green sub-pixel and a sixth green sub-pixel among the plurality of green sub-pixels may be disposed between adjacent groups of the plurality of groups. The blue sub-pixel, the fifth green sub-pixel, the sixth green sub-pixel, and the red sub-pixel may be connected to the one scan line.

According to an embodiment, responsive to a same data voltage applied to the plurality of data lines, a brightness of light emitted from the fifth green sub-pixel may be different from another brightness of light emitted from the sixth green sub-pixel.

According to an embodiment, the fifth green sub-pixel and the sixth green sub-pixel may be connected to different data lines.

According to an embodiment, an organic light emitting display device includes a plurality of data lines, a plurality of scan lines disposed intersecting with the plurality of data lines, and a plurality of sub-pixels each connected to at least one of the plurality of data lines and at least one of the plurality of scan lines. The plurality of sub-pixels includes a plurality of red sub-pixels, a plurality of green sub-pixels, and a plurality of blue sub-pixels. The plurality of blue sub-pixels and at least one of the plurality of green sub-pixels are connected to a first data line among the plurality of data lines. In the organic light emitting display device according to an embodiment, a green sub-pixel and a blue sub-pixel are connected to a data line, so that the sub-pixels can be disposed irregularly. Therefore, an artifact seen by a user can be minimized as compared with a case where only one color sub-pixel is connected to a data line.

According to an embodiment, one of the plurality of blue sub-pixels, a first of the plurality of green sub-pixels, one of the plurality of blue sub-pixels, and a second of the plurality of green sub-pixels may be connected to the first data line. A third of the plurality of green sub-pixels, a first of the plurality of red sub-pixels, a fourth of the plurality of green sub-pixels, and a second of the plurality of red sub-pixels may be connected to a second data line adjacent to the first data line among the plurality of data lines.

According to an embodiment, a first of the plurality of blue sub-pixels, two of the plurality of green sub-pixels, and a second of the plurality of blue sub-pixels may be connected to the first data line. A first of the plurality of green sub-pixels, two of the plurality of red sub-pixels, and a second of the plurality of green sub-pixels may be connected to a second data line adjacent to the first data line among the plurality of data lines.

According to an embodiment, a first of the plurality of blue sub-pixels, a first of the plurality of green sub-pixels, a first of the plurality of red sub-pixels, and a second of the plurality of blue sub-pixels may be connected to the first data line. A second of the plurality of green sub-pixels, a second of the plurality of red sub-pixels, and two of the plurality of green sub-pixels may be connected to a second data line adjacent to the first data line among the plurality of data lines.

According to an embodiment, a first of the plurality of blue sub-pixels, a first of the plurality of red sub-pixels, a second of the plurality of blue sub-pixels, and one of the plurality of green sub-pixels may be connected to the first data line. Three of the plurality of green sub-pixels and a second of the plurality of red sub-pixels may be connected to a second data line adjacent to the first data line among the plurality of data lines.

According to another embodiment, an organic light emitting display device includes a plurality of data lines, a plurality of scan lines disposed intersecting with the plurality of data lines, and a plurality of sub-pixels each connected to at least one of the plurality of data lines and at least one of the plurality of scan lines. The plurality of sub-pixels includes a plurality of red sub-pixels, a plurality of green sub-pixels, and a plurality of blue sub-pixels. The plurality of blue sub-pixels, a first subset of the plurality of green sub-pixels, and a first subset of the plurality of red sub-pixels are connected to a first data line among the plurality of data lines. A second subset of the plurality of green sub-pixels and a second subset of the plurality of green sub-pixels are connected to a second data line adjacent to the first data line among the plurality of data lines. In the organic light emitting display device according to an embodiment, the plurality of green sub-pixels are not all connected to a same data line. Instead, the first subset of the plurality of green sub-pixels are connected to the first data line and second subset of the plurality of green sub-pixels are connected to the second data line. Therefore, parasitic capacitance generated between adjacent green sub-pixels may cause a difference in brightness of light between the adjacent green sub-pixels. Thus, the green sub-pixels can be seen as being disposed irregularly and an image in the green sub-pixels can be compensated, so that an image quality can be improved.

According to an embodiment, the plurality of green sub-pixels may be overlapped with the second data line.

According to an embodiment, responsive to a same data voltage applied to each of the plurality of data lines, a brightness of light emitted from the first subset of the plurality of green sub-pixels connected to the first data line may be different from another brightness of light emitted from the second subset of the plurality of green sub-pixels connected to the second data line.

According to an embodiment, a first of the plurality of blue sub-pixels, a first of the plurality of green sub-pixels, one of the plurality of red sub-pixels, and a second of the plurality of blue sub-pixels may be connected to the first data line. A second of the plurality of green sub-pixels, another of the plurality of red sub-pixels, and two of the plurality of green sub-pixels may be connected to the second data line.

According to an embodiment, a first of the plurality of blue sub-pixels, a first of the plurality of red sub-pixels, a second of the plurality of blue sub-pixels, and one of the plurality of green sub-pixels may be connected to the first data line. Three of the plurality of green sub-pixels and a second of the plurality of red sub-pixels may be connected to the second data line.

Although the embodiments of the present disclosure have been described in detail with reference to the accompanying drawings, the present disclosure is not limited thereto and may be embodied in many different forms without departing from technical concepts of the present disclosure. Therefore, the embodiments of the present disclosure are provided for illustrative purposes only but not intended to limit technical concepts of the present disclosure. The scope of technical concepts of the present disclosure are not limited thereto. Therefore, it should be understood that the above-described embodiments are illustrative in all aspects and do not limit the present disclosure. The scope of the present disclosure should be construed based on the following claims, and all the technical concepts in the equivalent scope thereof should be construed as falling within the scope of the present disclosure.

What is claimed is:

1. An organic light emitting display device, comprising:
   a plurality of data lines;
   a plurality of scan lines disposed intersecting with the plurality of data lines; and
   a plurality of sub-pixels each connected to at least one of the plurality of data lines and at least one of the plurality of scan lines,
   wherein the plurality of sub-pixels includes a red sub-pixel, a plurality of green sub-pixels, and a blue sub-pixel, and
   at least one of the plurality of green sub-pixels, and at least one of the blue sub-pixel and the red sub-pixel, are connected to a first data line of the plurality of data lines.

2. The organic light emitting display device according to claim 1, wherein the plurality of green sub-pixels includes a first green sub-pixel and a second green sub-pixel,
   the first green sub-pixel and the blue sub-pixel being connected to the first data line of the plurality of data lines,
   the second green sub-pixel and the red sub-pixel being connected to a second data line, adjacent to the first data line, of the plurality of data lines, and
   the first green sub-pixel and the second green sub-pixel being vertically disposed along an extension direction of the plurality of data lines.

3. The organic light emitting display device according to claim 2, wherein the first green sub-pixel and the second green sub-pixel are connected to different data lines.

4. The organic light emitting display device according to claim 3, wherein responsive to a same data voltage applied to each of the plurality of data lines, a brightness of light emitted from the first green sub-pixel is different from another brightness of light emitted from the second green sub-pixel.

5. The organic light emitting display device according to claim 1, wherein the blue sub-pixel and a first subset of the plurality of green sub-pixels are connected to the first data line of the plurality of data lines,
   the red sub-pixel and a second subset of the plurality of green sub-pixels being connected to a second data line, adjacent to the first data line, of the plurality of data lines,
   the first subset of the plurality of green sub-pixels being vertically disposed along a first extension direction of the first data line, and
   the second subset of the plurality of green sub-pixels being vertically disposed along a second extension direction of the second data line.

6. The organic light emitting display device according to claim 5, wherein the first subset of the plurality of green sub-pixels are overlapped with the second data line, and
   wherein the second subset of the plurality of green sub-pixels are overlapped with the second data line.

7. The organic light emitting display device according to claim 2, wherein the first green sub-pixel and the second green sub-pixel are each disposed to be overlapped on the second data line adjacent to the first data line.

8. The organic light emitting display device according to claim 1, wherein the blue sub-pixel and the red sub-pixel are adjacent to each other along an extension direction of the plurality of scan lines, and
   wherein a sub-pixel group including the blue sub-pixel and the red sub-pixel is connected to at least one of the plurality of scan lines between the plurality of green sub-pixels.

9. The organic light emitting display device according to claim 1, further comprising:
   a plurality of red sub-pixels including at least the red sub-pixel;
   a plurality of blue sub-pixels including at least the blue sub-pixel;
   wherein the plurality of red sub-pixels, the plurality of green sub-pixels, and the plurality of blue sub-pixels are connected to one scan line of the plurality of scan lines,
   wherein each of the plurality of red sub-pixels is disposed adjacent to one of the plurality of blue sub-pixels to form a plurality of groups, and
   wherein an equal number of green sub-pixels of the plurality of green sub-pixels are disposed between adjacent groups of the plurality of groups.

10. The organic light emitting display device according to claim 9, wherein a fifth green sub-pixel and a sixth green sub-pixel of the plurality of green sub-pixels are disposed between adjacent groups of the plurality of groups, and
    wherein the blue sub-pixel, the fifth green sub-pixel, the sixth green sub-pixel, and the red sub-pixel are connected to the one scan line.

11. The organic light emitting display device according to claim 10, wherein responsive to a same data voltage applied to the plurality of data lines, a brightness of light emitted from the fifth green sub-pixel is different from another brightness of light emitted from the sixth green sub-pixel.

12. The organic light emitting display device according to claim 10, wherein the fifth green sub-pixel and the sixth green sub-pixel are connected to different data lines.

13. An organic light emitting display device, comprising:
    a plurality of data lines;
    a plurality of scan lines disposed intersecting with the plurality of data lines; and
    a plurality of sub-pixels each connected to at least one of the plurality of data lines and at least one of the plurality of scan lines,
    wherein the plurality of sub-pixels includes a plurality of red sub-pixels, a plurality of green sub-pixels, and a plurality of blue sub-pixels, and
    wherein the plurality of blue sub-pixels and at least one of the plurality of green sub-pixels are connected to a first data line of the plurality of data lines.

14. The organic light emitting display device according to claim 13, wherein one of the plurality of blue sub-pixels, a first of the plurality of green sub-pixels, one of the plurality of blue sub-pixels, and a second of the plurality of green sub-pixels are connected to the first data line, and
    wherein a third of the plurality of green sub-pixels, a first of the plurality of red sub-pixels, a fourth of the plurality of green sub-pixels, and a second of the plurality of red sub-pixels are connected to a second data line, adjacent to the first data line, of the plurality of data lines.

15. The organic light emitting display device according to claim 13, wherein a first of the plurality of blue sub-pixels, two of the plurality of green sub-pixels, and a second of the plurality of blue sub-pixels are connected to the first data line, and
    wherein a first of the plurality of green sub-pixels, two of the plurality of red sub-pixels, and a second of the plurality of green sub-pixels are connected to a second data line, adjacent to the first data line, of the plurality of data lines.

16. The organic light emitting display device according to claim 13, wherein a first of the plurality of blue sub-pixels, a first of the plurality of green sub-pixels, a first of the plurality of red sub-pixels, and a second of the plurality of blue sub-pixels are connected to the first data line, and wherein a second of the plurality of green sub-pixels, a second of the plurality of red sub-pixels, and two of the plurality of green sub-pixels are connected to a second data line, adjacent to the first data line, of the plurality of data lines.

17. The organic light emitting display device according to claim 13, wherein a first of the plurality of blue sub-pixels, a first of the plurality of red sub-pixels, a second of the plurality of blue sub-pixels, and one of the plurality of green sub-pixels are connected to the first data line, and wherein three of the plurality of green sub-pixels and a second of the plurality of red sub-pixels are connected to a second data line, adjacent to the first data line, of the plurality of data lines.

18. An organic light emitting display device, comprising:
a plurality of data lines;
a plurality of scan lines disposed intersecting with the plurality of data lines; and
a plurality of sub-pixels each connected to at least one of the plurality of data lines and at least one of the plurality of scan lines,
wherein the plurality of sub-pixels includes a plurality of red sub-pixels, a plurality of green sub-pixels, and a plurality of blue sub-pixels,
wherein the plurality of blue sub-pixels, a first subset of the plurality of green sub-pixels, and a first subset of the plurality of red sub-pixels are connected to a first data line of the plurality of data lines, and
a second subset of the plurality of green sub-pixels and a second subset of the plurality of red sub-pixels are connected to a second data line, adjacent to the first data line, of the plurality of data lines.

19. The organic light emitting display device according to claim 18, wherein the plurality of green sub-pixels are overlapped with the second data line.

20. The organic light emitting display device according to claim 19, wherein responsive to a same data voltage applied to each of the plurality of data lines, a brightness of light emitted from the first subset of the plurality of green sub-pixels connected to the first data line is different from another brightness of light emitted from the second subset of the plurality of green sub-pixels connected to the second data line.

21. The organic light emitting display device according to claim 18, wherein a first of the plurality of blue sub-pixels, a first of the plurality of green sub-pixels, one of the plurality of red sub-pixels, and a second of the plurality of blue sub-pixels are connected to the first data line, and wherein a second of the plurality of green sub-pixels, another of the plurality of red sub-pixels, and two of the plurality of green sub-pixels are connected to the second data line.

22. The organic light emitting display device according to claim 18, wherein a first of the plurality of blue sub-pixels, a first of the plurality of red sub-pixels, a second of the plurality of blue sub-pixels, and one of the plurality of green sub-pixels are connected to the first data line, and wherein three of the plurality of green sub-pixels and a second of the plurality of red sub-pixels are connected to the second data line.

* * * * *